(12) United States Patent  
Marques et al.

(10) Patent No.: US 10,574,185 B2  
(45) Date of Patent: Feb. 25, 2020

(54) CRYSTAL DRIVER CIRCUIT WITH CORE AMPLIFIER HAVING UNBALANCED TUNE CAPACITORS

(71) Applicant: SILICON LABORATORIES INC., Austin, TX (US)

(72) Inventors: Tiago Marques, Austin, TX (US); John Khoury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 196 days.

(21) Appl. No.: 15/639,267

(22) Filed: Jun. 30, 2017

(65) Prior Publication Data

US 2019/0006991 A1    Jan. 3, 2019

(51) Int. Cl.
*H03B 5/36* (2006.01)
*H03B 5/04* (2006.01)

(52) U.S. Cl.
CPC .............. *H03B 5/366* (2013.01); *H03B 5/04* (2013.01); *H03B 5/364* (2013.01); *H03B 2200/004* (2013.01); *H03B 2200/005* (2013.01); *H03B 2200/0068* (2013.01); *H03B 2201/0208* (2013.01); *H03B 2201/0266* (2013.01)

(58) Field of Classification Search
CPC .......... H03B 5/04; H03B 5/364; H03B 5/366; H03B 2201/0266; H03B 2201/0208; H03B 2200/005; H03B 2200/004; H03B 2200/0068

See application file for complete search history.

(56) References Cited

U.S. PATENT DOCUMENTS

| | | | |
|---|---|---|---|
| 4,321,562 A | 3/1982 | Igarashi | |
| 4,896,122 A | 1/1990 | Tahernia et al. | |
| 4,956,618 A | 9/1990 | Ulmer | |
| 5,041,802 A | 8/1991 | Wei et al. | |
| 5,208,558 A | 5/1993 | Shigehara et al. | |
| 5,416,445 A | 5/1995 | Narahara | |
| 5,453,719 A | 9/1995 | Narahara | |
| 5,900,787 A | 5/1999 | Yoshimura | |
| 5,912,594 A | 6/1999 | Burkhard | |
| 5,994,970 A * | 11/1999 | Cole | H03L 1/026 331/116 FE |

(Continued)

OTHER PUBLICATIONS

Stephens, Ransom. "The Future of Multi-Clock Systems." Frequency Controls, Inc. 2007 pp. 1-14.

*Primary Examiner* — Jeffrey M Shin
(74) *Attorney, Agent, or Firm* — Gary Stanford; Huffman Law Group, PC

(57) ABSTRACT

A crystal driver circuit for driving a crystal to oscillate at a resonant frequency including an amplifier having an input coupled to an amplifier input node and having an output coupled to an amplifier output node, a current source that provides a core bias current to the amplifier, a first tune capacitor coupled between the amplifier output node and a reference node, and a second tune capacitor coupled between the amplifier input node and the reference node. The first tune capacitor has a first capacitance that is greater than a second capacitance of the second tune capacitor by a capacitance offset that reduces frequency shift during operation. The first and second capacitances have a combined capacitance that achieves an oscillating signal having a target frequency.

20 Claims, 3 Drawing Sheets

(56) References Cited

U.S. PATENT DOCUMENTS

| | | | |
|---|---|---|---|
| 6,094,105 A | 7/2000 | Williamson | |
| 6,097,257 A | 8/2000 | Kadowaki et al. | |
| 6,133,801 A | 10/2000 | Tanaka | |
| 6,653,908 B1 | 11/2003 | Jones | |
| 6,696,899 B2 | 2/2004 | Ruffieux | |
| 6,782,485 B2 | 8/2004 | Takei | |
| 7,034,628 B1 | 4/2006 | Lu et al. | |
| 7,348,861 B1 | 3/2008 | Wu et al. | |
| 7,808,334 B2 | 10/2010 | Yoshida et al. | |
| 7,868,710 B1 * | 1/2011 | Farahvash | H03B 5/366 331/158 |
| 7,961,060 B1 | 6/2011 | McMenamy et al. | |
| 8,324,978 B2 | 12/2012 | Loeda | |
| 8,395,456 B2 | 3/2013 | Badillo et al. | |
| 9,614,509 B1 | 4/2017 | Ahmed | |
| 2003/0067361 A1 * | 4/2003 | Takahashi | H03L 1/025 331/176 |
| 2004/0169562 A1 | 9/2004 | Novac | |
| 2005/0017812 A1 | 1/2005 | Ashida et al. | |
| 2008/0211592 A1 | 9/2008 | Gaussen | |
| 2009/0002087 A1 | 1/2009 | Toffolon et al. | |
| 2009/0096541 A1 * | 4/2009 | Tran | H03B 5/06 331/116 FE |
| 2009/0121799 A1 | 5/2009 | Ishikawa | |
| 2011/0037527 A1 | 2/2011 | Shrivastava et al. | |
| 2011/0291767 A1 | 12/2011 | Ishikawa et al. | |
| 2012/0242418 A1 | 9/2012 | Takahashi | |
| 2013/0154754 A1 | 6/2013 | Frank | |
| 2014/0035689 A1 * | 2/2014 | Ozawa | H03B 5/364 331/158 |
| 2014/0091872 A1 | 4/2014 | Itasaka | |
| 2014/0320223 A1 | 10/2014 | Ozawa et al. | |
| 2016/0072438 A1 | 3/2016 | Fukahori | |
| 2019/0006990 A1 | 1/2019 | Marques et al. | |
| 2019/0006992 A1 | 1/2019 | Marques | |
| 2019/0007005 A1 | 1/2019 | Marques | |
| 2019/0007012 A1 | 1/2019 | Marques | |

\* cited by examiner

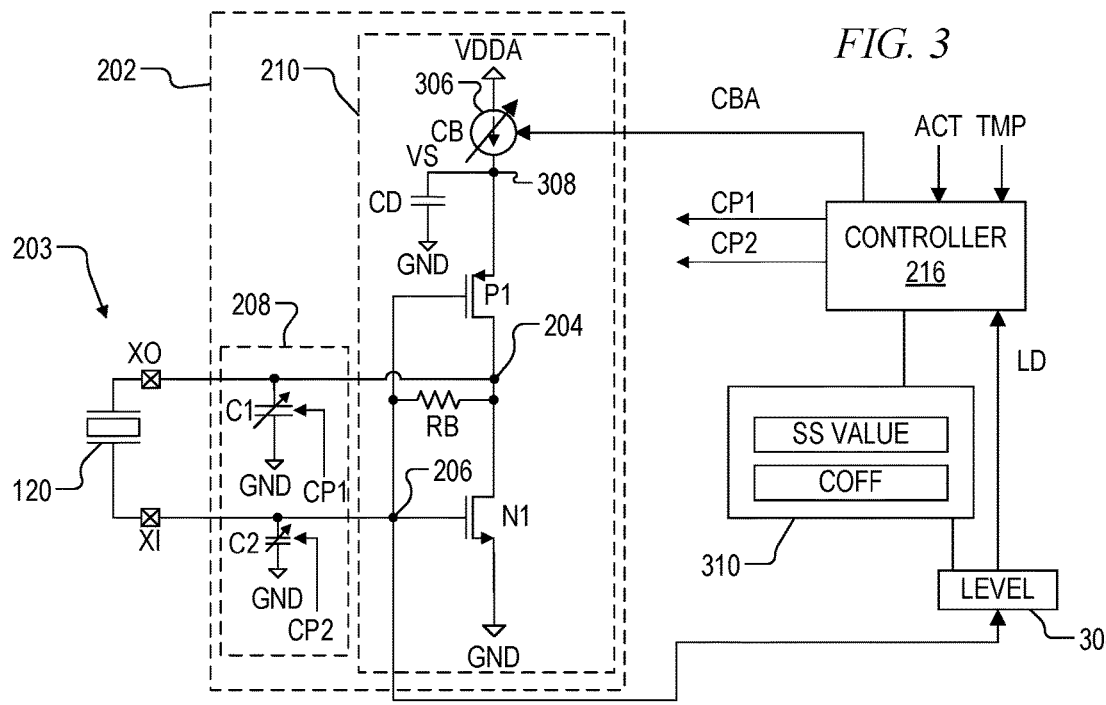
FIG. 3
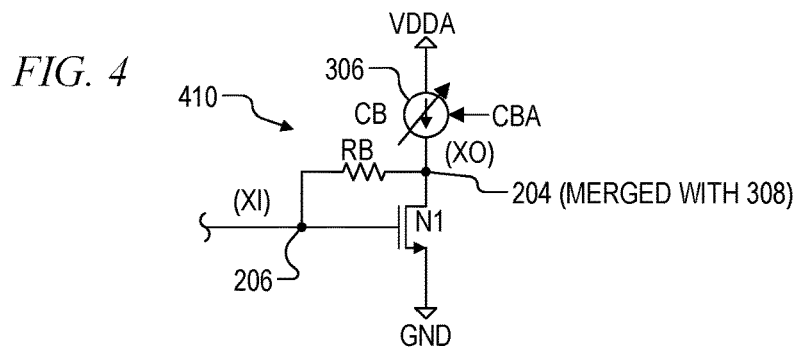
FIG. 4
FIG. 5

CRYSTAL DRIVER CIRCUIT WITH CORE AMPLIFIER HAVING UNBALANCED TUNE CAPACITORS

CROSS REFERENCE TO RELATED APPLICATION(S)

This application is related to the following U.S. Patent Applications which are filed concurrently herewith and which are hereby incorporated by reference in their entireties for all intents and purposes.

| SER. NO. | FILING DATE | TITLE |
|---|---|---|
| 15/639,038 | Jun. 30, 2017 | CRYSTAL AMPLIFIER WITH ADDITIONAL HIGH GAIN AMPLIFIER CORE TO OPTIMIZE STARTUP OPERATION |
| 15/639,137 | Jun. 30, 2017 | CRYSTAL AMPLIFIER WITH RESISTIVE DEGENERATION |
| 15/645,684 | Jul. 10, 2017 | CRYSTAL DRIVER CIRCUIT CONFIGURABLE FOR DAISY CHAINING |
| 15/724,714 | Oct. 4, 2017 | CRYSTAL DRIVER CIRCUIT WITH EXTERNAL OSCILLATION SIGNAL AMPLITUDE CONTROL |

BACKGROUND OF THE INVENTION

Field of the Invention

The present invention relates in general to crystal oscillators, and more particularly, to a crystal amplifier for a crystal oscillator with unbalanced tune capacitors for reducing frequency shift.

Description of the Related Art

A crystal oscillator uses the mechanical resonance of a crystal to create an electrical sinusoidal signal having a precise frequency. The crystal oscillator includes a crystal amplifier providing a "negative" resistance that cancels losses of the crystal to establish and maintain oscillation. In certain configurations, the crystal amplifier may include an N-channel MOS (NMOS) or a complementary MOS (CMOS) amplifier having an input and output for coupling across the crystal. The crystal may be modeled as a series combination of a motional capacitance, inductance, and resistance, and the crystal amplifier may be modeled as a negative resistance. The crystal oscillator frequency is tuned by a pair of tune capacitors coupled between the crystal terminals and a reference node (e.g., ground). The combined capacitance of the tune capacitors (or load capacitors) is selected for a given crystal to match the load capacitance that the crystal vendor mandates to achieve the desired frequency. The combined capacitance CL (or load capacitance) of a pair of tune capacitors C1 and C2 is defined as CL=(C1*C2)/(C1+C2). In a conventional configuration, the tune capacitors are set to the same capacitance value to optimize capacitor area.

The crystal amplifier has an input and an output for coupling across the crystal, and further includes a current source that generates a core bias current to establish the gain of the amplifier. During steady state operation, the core bias current is set at a steady state current level to obtain or otherwise maintain a target characteristic (other than the precise frequency), such as the signal level at the input or output of the amplifier. The steady state current level may be predetermined for a known crystal based on the crystal type and specification. Alternatively, the core bias current may be determined or changed during operation using an automatic gain control (AGC) process or the like to re-adjust the signal amplitude to a target level.

As the temperature rises, the amplitude of the oscillating signal typically decreases and the frequency also changes. Changes in temperature have an effect on the operation of crystal as well as the crystal amplifier. At certain increments of temperature change, the AGC process may be re-run to adjust the core bias current to return the amplitude of the oscillating signal back to the target value. A change in temperature by itself changes the nonlinear distortion level of the crystal amplifier and the change in distortion causes a change in frequency. Also, the change in the core bias current in response to the AGC optimization causes a change in distortion level which leads to an additional change in frequency. Described another way, when the temperature and core bias current are changed, the average impedance looking into the amplifier output from the crystal changes in a manner equivalent to a shift in the load capacitance, which causes a frequency shift. Although these changes may be relatively small, in some cases the total allowed temperature drift is below 20 parts-per-million (ppm) or even lower. The frequency deviation or drift needs to account for crystal and amplifier induced frequency variation, ideally the amplifier caused variation should be minimal to account for the expected changes in the crystal itself.

SUMMARY OF THE INVENTION

A crystal driver circuit for driving a crystal to oscillate at a resonant frequency according to one embodiment includes an amplifier having an input coupled to an amplifier input node and having an output coupled to an amplifier output node, a current source that provides a core bias current to the amplifier, a first tune capacitor coupled between the amplifier output node and a reference node, and a second tune capacitor coupled between the amplifier input node and the reference node. The first tune capacitor has a first capacitance that is greater than a second capacitance of the second tune capacitor by a capacitance offset that reduces frequency shift during operation. The first and second capacitances have a combined capacitance that achieves an oscillating signal having a target frequency.

The first and second tune capacitors may be adjustable, in which a controller may be provided for adjusting the tune capacitors. A memory may be included that stores an offset value indicative of the capacitance offset, where controller uses the offset value to set the first and second capacitances. Each of the tune capacitors may include multiple capacitors and corresponding switches, in which the controller controls the switches for selecting from among the capacitors. The capacitors and switches for each of the adjustable tune capacitors may be organized as a set of switch-capacitor pairs coupled in parallel between first and second capacitor terminals. The capacitors of each adjustable tune capacitor may be organized as a binary progression of capacitances based on a nominal capacitance value. The controller may provide a digital code to control the switches for selecting and adjusting the first and second capacitances as a multiple of the nominal capacitance value. A balance capacitor may be coupled between the first and second capacitor terminals having a capacitance that compensates for a difference between parasitic capacitances of the amplifier input node and the amplifier output node.

The amplifier may be implemented according to a CMOS configuration or an NMOS configuration.

An electronic circuit according to one embodiment includes a crystal, a crystal amplifier, and first and second tune capacitors. The crystal amplifier includes an amplifier and a current source. The amplifier has an input coupled to the first terminal of the crystal and has an output coupled to the second terminal of the crystal. The current source provides a core bias current to the amplifier. The first tune capacitor is coupled between the second terminal of the crystal and a reference node and has a first capacitance. The second tune capacitor is coupled between the first terminal of the crystal and the reference node and has a second capacitance. The first capacitance is greater than the second capacitance by a capacitance offset.

Each tune capacitor may be adjustable having an adjust input, and a controller may be provided and coupled to the adjust inputs of the tune capacitors. The first and second tune capacitors may each include multiple capacitors and corresponding switches, in which the controller controls the switches for selecting from among the capacitors of each tune capacitor.

A method of driving a crystal to oscillate at a resonant frequency according to one embodiment includes providing an amplifier input node and an amplifier output node for coupling across the crystal, providing an amplifier having an input coupled to the amplifier input node and having an output coupled to the amplifier output node, providing a core bias current to drive the amplifier, providing a first tune capacitor coupled between the amplifier output node and a reference node and having a first capacitance, providing a second tune capacitor coupled between the amplifier input node and the reference node and having a second capacitance, and setting the first capacitance greater than the second capacitance by a capacitance offset that reduces frequency shift during operation.

The method may include setting the first and second capacitances to have a combined capacitance that achieves an oscillating signal having a target frequency and a target amplitude. The method may include providing a first adjustable tune capacitor, providing a second adjustable tune capacitor, and adjusting the first and second capacitances with the capacitance offset and to have a combined capacitance that achieves an oscillating signal having a target frequency. The method may include storing an offset value indicative of the capacitance offset.

The method may include multiple capacitors and corresponding switches for each adjustable tune capacitor. The method may include providing switch-capacitor pairs coupled in parallel between first and second capacitor terminals. The method may include organizing the capacitors of each tune capacitor as a binary progression of capacitances based on a nominal capacitance value. The method may include controlling the switches by providing a digital code for selecting either one of the first and second capacitances as a multiple of the nominal capacitance value. The method may include providing a balance capacitor coupled between the first and second capacitor terminals having a capacitance that compensates for a difference between parasitic capacitances of the amplifier input node and the amplifier output node.

The method may include integrating the input node, the output node, the amplifier, and a current source on an integrated circuit, and coupling at least one external capacitor to the integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 is a schematic and block diagram of the crystal amplifier of FIG. 2 implemented according to one embodiment of the present invention shown coupled to the crystal a controller, and further including a level detector and a memory.

FIG. 4 is a schematic diagram of an alternative amplifier core that may replace the amplifier core of FIG. 3.

FIG. 5 is a simplified schematic diagram of an adjustable tune capacitor that may be used as either one or both of the capacitors C1 and C2 of FIG. 3.

DETAILED DESCRIPTION

The inventors have recognized the need to reduce distortion which is a major contributor to the frequency drift over temperature with or without AGC optimization. When an output signal of a crystal amplifier is close to the rails, the amplifying devices get close to the triode region reducing their output impedance, and during that part of the oscillation cycle the impedance as applied to the crystal reduces, resulting in a reduction of average impedance. The reduction of the average impedance provided to the crystal causes a change in the average load capacitance, which leads to a change in frequency.

The inventors have therefore developed a crystal amplifier with unbalanced tune capacitors that reduces the distortion and frequency drift with temperature changes while keeping the same oscillation amplitude thus optimizing other design parameters such as phase noise and forward or reverse power supply rejection. The combined capacitance of the tune capacitors remains substantially unmodified to allow operation at the correct load capacitance that a given crystal is designed for. The capacitance of the tune capacitor coupled to the amplifier output, however, is increased while the capacitance of the tune capacitor coupled to the amplifier input is correspondingly decreased so that the tune capacitors are unbalanced. The unbalanced tune capacitors tend to improve frequency stability over temperature. Increasing the capacitance loading on the amplifier output relative to the amplifier input causes the impedance change due to distortion on the amplifier output to be smaller since the capacitance is more dominant. Also, increasing the capacitance loading on the amplifier output reduces the amplitude of the oscillating signal on the amplifier output, so that the oscillating signal waveform on the amplifier output is more linear.

Figure 1:
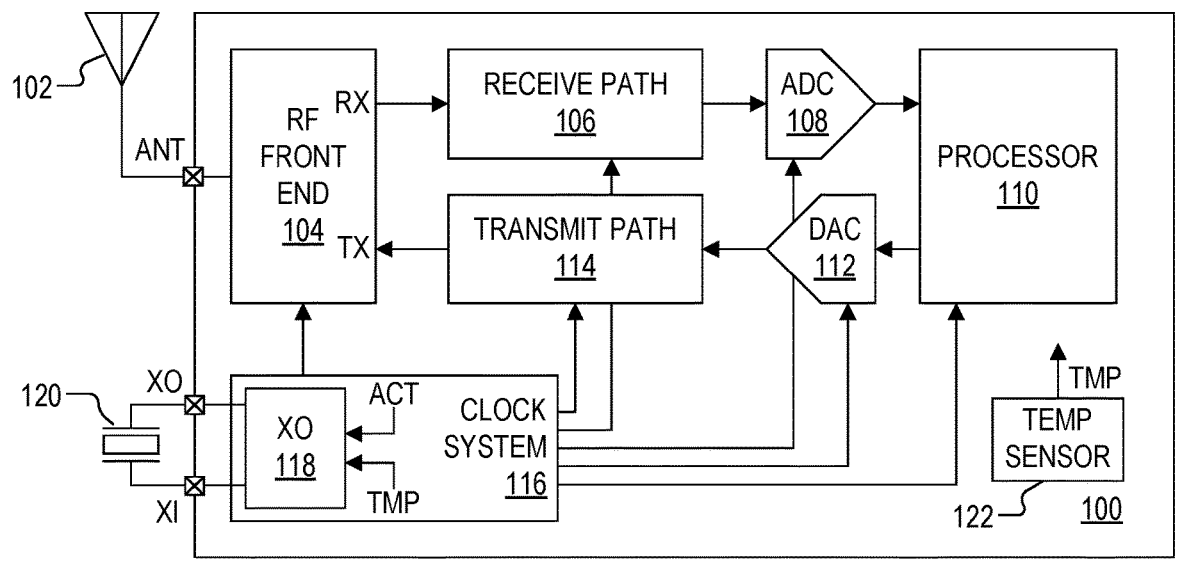
FIG. 1 is a simplified block diagram of a transceiver including a crystal oscillator (XO) system implemented according to one embodiment of the present invention.

FIG. 1 is a simplified block diagram of a transceiver 100 including a crystal oscillator (XO) system 118 implemented according to one embodiment of the present invention. The illustrated transceiver 100 is shown in generalized form for any of various wireless communication applications, such as Bluetooth®, Zigbee, Wi-Fi, etc. Other functional circuit blocks and circuits may be included for particular applications, but are not shown as not necessary for a full and complete understanding of the present invention. The transceiver 100 may be implemented on an integrated circuit (IC) or semiconductor chip or the like, which may be mounted on a printed circuit board (PCB) (not shown), a module (not shown), or the like as part of an electronic system. It is noted that the XO system 118 may be integrated on a separate IC or semiconductor chip or the like either alone or as part of a separate clock system (e.g., shown as a clock system 116).

The electronic system incorporating the transceiver 100 is any one of various configurations, such as a communication device (hand-held, mobile, stationary, etc.), a computer system (laptop, desktop, server system, etc.), a computer peripheral device (e.g., printer, router, etc.), or any other devices that may be networked together via wired and/or wireless communications. The present disclosure contemplates the use of the transceiver 100 incorporated within a device that may be part of a suite of components of an Internet of Things (IoT) platform or the like. The components or devices may be powered from an external source (e.g., AC outlet or the like), or may be battery-operated. Although the present invention is illustrated within a wireless communication system, it is understood that the present invention is not limited to wireless communications and may be used in any application that uses a crystal oscillator.

The transceiver 100 includes a radio frequency (RF) front end 104 coupled to an antenna 102 via an antenna pin ANT (or other appropriate antenna interface) for receiving and transmitting RF signals. The RF front end 104 has a receive (RX) output coupled to the input of a receive path 106, which processes received signals and which provides a processed analog baseband signal at its output for conversion to digital format by an analog to digital converter (ADC) 108. The ADC 108 provides digital baseband signals to a processor 110, which further processes the digital baseband signals according to the particular application. The processor 110 also encapsulates and provides digital baseband signals for transmission, which are converted to analog format by a digital to analog converter (DAC) 112, which has an output provided to an input of a transmit path 114. The output of the transmit path 114 is provided to a transmit (TX) input of the RF front end 104, which ultimately transmits the information via the antenna 102.

The particular details of each of the functional blocks are beyond the scope of the present disclosure. In one embodiment, for example, the RF front end 104 may include one or more mixers that downconvert received RF signals to an intermediate frequency (IF), or that directly convert received RF signals to baseband signals, which are further processed by the receive path 106. In an IF configuration, the receive path 106 further includes one or more mixers or the like for downconverting IF signals to the baseband signals. In either case, the receive path 106 further includes amplifiers (e.g., programmable gain amplifiers or PGAs), filters (e.g., lowpass filters or LPFs), peak detectors, and other supporting circuitry for isolating and processing the baseband signals for digital conversion for further processing by the processor 110. The transmit path 114 includes similar functions for processing an analog baseband signal from the DAC 112 for transmission by the RF front and 104 to external devices or components.

The transceiver 100 further includes the clock system 116 incorporating the XO system 118 which is coupled to an external crystal 120 via an amplifier output pin XO and an amplifier input pin XI. The clock system 116 generally develops one or more clock signals for use by the various functional blocks of the transceiver 100. The present disclosure primarily concerns the XO system 118 including a crystal amplifier for driving the crystal 120 to develop an oscillation signal used for developing one or more clock signals. Although not shown, the clock system 116 may include additional crystal amplifiers, which may include high frequency and/or low frequency variations, along with one or more resistor-capacitor (RC) oscillators and the like. In one embodiment, the XO system 118 is maintained in a power-down or standby mode when not being used. In the illustrated configuration, the transceiver 100 and/or the clock system 116 provides an activation signal ACT which is asserted to activate or enable the XO system 118 and negated to place the XO system 118 into the standby mode.

Various methods may be used for determining and/or reporting the temperature of the IC and/or the semiconductor chip incorporating the transceiver 100 and/or the electronic system. The electronic system may include a temperature sensor or the like (not shown) that provides a temperature value to the transceiver 100 via an appropriate interface or via other communicating method. In another embodiment, the transceiver 100 includes a temperature sensor 122 providing a temperature value TMP indicative of the IC or ambient temperature. In yet another embodiment, the crystal case can include a thermistor that the electronic system may drive, measure and extract crystal temperature. The temperature value TMP is shown provided to the XO system 118. In an alternative embodiment, the XO system 118 does not receive a temperature indication but instead the transceiver 100 or the electronic system itself handles issues related to temperature.

Figure 2:
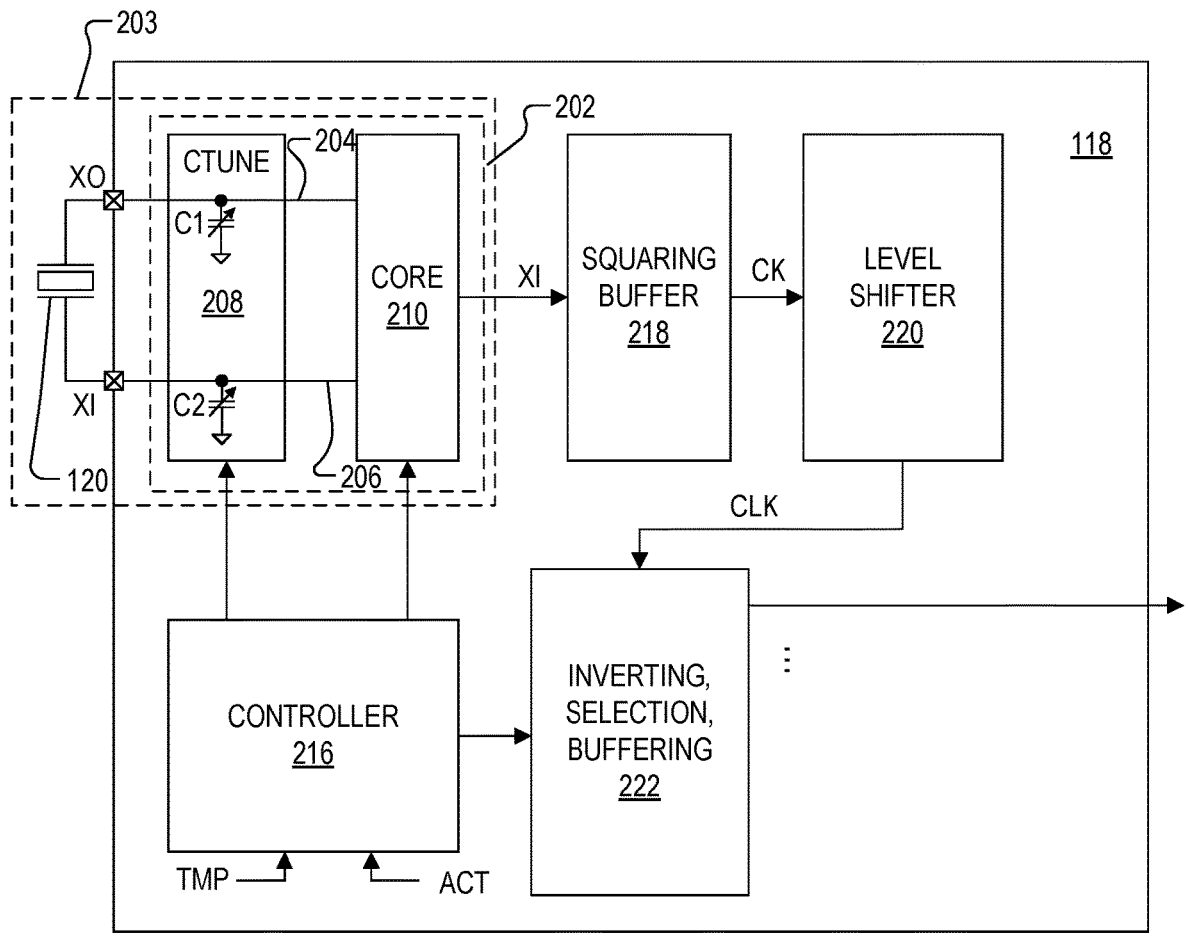
FIG. 2 is a simplified block diagram of the XO system of FIG. 1 incorporating a single crystal amplifier and supporting circuitry.

FIG. 2 is a simplified block diagram of the XO system 118 incorporating a single crystal amplifier 202 and supporting circuitry. The crystal 120 is coupled between the XO and XI pins of the transceiver 100, in which XO is internally coupled an amplifier output node 204 and XI is internally coupled to an amplifier input node 206. As used herein, "XO" generally refers to the XO pin and/or the amplifier output node 204 and "XI" generally refers to the XI pin and/or the amplifier input node 206. It is noted that the combination of the crystal amplifier 202 and the crystal 120 is referred to as a crystal oscillator 203. The crystal amplifier 202 includes a tune capacitor (CTUNE) circuit 208 and an amplifier core 210, which are both coupled to the amplifier input and output nodes 204 and 206. The CTUNE circuit 208 includes a first adjustable capacitor C1 coupled between the amplifier output node 204 and a reference node and a second adjustable capacitor C2 coupled between the amplifier input node 206 and the reference node. The reference node develops a suitable positive, negative or zero voltage level, such as ground (GND). The controller 216 receives the ACT signal for activating the XO system 118 and for returning the XO system 118 to the standby mode. The controller 216 has an adjust output to adjust the capacitance values of the first and second adjustable capacitors C1 and C2. The controller 216 has one or more additional outputs for adjusting operation of the amplifier core 210. The controller 216 may also have one or more additional outputs for enabling various blocks and for controlling various parameters of the amplifier core 210 as further described herein.

In the illustrated embodiment, the controller 216 is shown receiving TMP providing an indication of the temperature. The controller 216 may use the indication of temperature to invoke an AGC process, such as when the temperature has changed by a certain amount. Alternatively, the AGC process may be performed upon each startup of the crystal oscillator 203. Alternatively, the transceiver 100 and/or the electronic system may invoke the AGC process based on temperature or other operating conditions. In any case, the AGC process may be invoked to adjust the level of the oscillating signal on XI or XO.

The crystal amplifier 202 sustains oscillation of the crystal 120 by generating the appropriate level of negative resistance between XO and XI (coupled across the crystal 120) to develop an oscillating signal. The oscillating signal generally has a sinusoidal waveform, which is provided to an input of a squaring buffer 218. The squaring buffer 218 converts the oscillating signal on XI (or, alternatively, XO) to a squarewave clock signal CK, which is provided to an input of a level shifter 220. The level shifter 220 adjusts the voltage level of CK and provides a corresponding clock signal CLK to an input of an inverting, selection, and buffering circuit 222. The inverting, selection, and buffering circuit 222 incorporates multiple inverters, multiplexers (MUXes), and buffers or the like for providing multiple clock signals and inverted clock signals based on CLK. The inverting, selection, and buffering circuit 222 may also convert one or more clock signals or inverted clock signals from single-ended to differential format. The controller 216 has corresponding outputs for selecting between each clock signal or its inverted version. One or more of the selected clock signals may be provided directly to selected portions of the transceiver 100. One or more of the selected clock signals may also be provided to other circuitry (not shown) within the clock system 116 for further processing, such as clock synthesizers or the like (not shown), for providing one or more modified clock signals (e.g., changes of one or more of frequency, duty cycle, amplitude, etc.) for use by other portions of the transceiver 100. The particular clock signals or uses thereof are not further described herein.

In the illustrated embodiments, the CTUNE circuit 208 is shown incorporated within the XO system 118 including adjustable capacitors C1 and C2. In one embodiment, C1 and C2 may provide the total combined or load capacitance. In another embodiment, the internal adjustable capacitors may be combined with external capacitors so that the internal CTUNE circuit 208 provides adjustability. In an alternative embodiment, the CTUNE circuit 208 may be omitted from the XO system 118 in which C1 and C2 are only provided externally. Thus, the tune capacitor C1 would instead be coupled externally between XO and GND and the tune capacitor C2 would instead be coupled externally between XI and GND. Furthermore, one or both of the capacitors C1 and C2 may be fixed in either configuration. Adjustablility is advantageous for tuning the frequency, but configurations with one or more fixed tune capacitors are contemplated.

FIG. 3 is a schematic and block diagram of the crystal amplifier 202 implemented according to one embodiment of the present invention shown coupled to the crystal 120 and the controller 216, and further including a level detector 304 and a memory 310. The level detector 304 has an input coupled to the amplifier input node 206 (XI) and has an output providing a level indication signal LD to an input of the controller 216. The level detector 304 may be implemented as a peak detector, an amplitude detector, a signal level detector, such as for determining the root-mean-square (RMS) level of an input voltage level, etc. The input of the level detector 304 may alternatively be coupled to the amplifier output node 208 (XO) or may include a select circuit or the like for selecting between XI and XO. The level detector 304 may be used to enable the controller 216 or the like to perform the AGC process to ensure that a level of an oscillating signal on XI is at or near a threshold level. It is noted that one or more threshold values (not shown) may be defined and stored in the memory 310 accessible by the controller 216 and the level detector 304.

The CTUNE circuit 208 includes the capacitors C1 and C2 coupled to XO and XI, respectively, as previously described. The amplifier core 210 includes an adjustable current source 306, a P-channel transistor P1, an N-channel transistor N1, a decoupling capacitor CD, and a bias resistor RB. The current source 306 is coupled to a source voltage VDDA, and provides a core bias (CB) current to a source node 308 developing a source voltage VS. The current source 306 includes an adjust input receiving a value CBA from the controller 216 for adjusting the level of the core bias current. The source node 308 is coupled to a source terminal of P1 and to one terminal of the decoupling capacitor CD. Transistor P1 has a drain terminal coupled to the amplifier output node 204 and has a gate terminal coupled to the amplifier input node 206. The amplifier output node 204 is further coupled to a drain terminal of N1, having its gate terminal coupled to the amplifier input node 206 and its source terminal coupled to GND. The bias resistor RB is coupled between the amplifier output node 204 and the amplifier input node 206.

It is noted that each of the transistors described herein, including P1 and N1, are one of at least two different conductivity types, such as either N-type (e.g., N-channel) or P-type (e.g., P-channel). Each transistor includes two current terminals (e.g., drain and source terminals), and a control terminal (e.g., gate terminal). In the illustrated configuration, each transistor may be configured as a MOS transistor or a FET or the like, including any one of various configurations of MOSFETs and the like. For example, the N-type transistors may be NMOS transistors or NFETs, and the P-type transistors may be PMOS transistors or PFETs.

The controller 216 may be implemented as a digital state machine or the like in which adjustments of the crystal amplifier 202 are made by providing and/or updating changing digital code values to various components. Although the controller 216 is shown embodied within a single block within the XO system 118, control functions may be distributed at various locations within the XO system 118 and/or within the clock system 116 and/or the transceiver 100. One or more of the digital code values as described herein may be adjustable or otherwise programmable within a corresponding programmable memory or the like (not shown). CBA, for example, may be a digital code value provided to the adjust input of the current source 306, in which the controller 216 adjusts CBA to modify the core bias current provided to the source node 308 accordingly. Likewise, the controller 216 may provide two separate digital code values, including CP1 for adjusting the capacitance of C1 and CP2 for adjusting the capacitance of C2. The controller 216 is shown receiving ACT and TMP.

In an alternative embodiment, a set of fuses or the like may be used for setting or adjusting the CP1 and CP2 values, such as by selectively blowing one or more fuses provided on the IC. The fuses may be provided separately or as part of the controller 216. One limitation of fuses is that once the fuses are blown for a given chip, the corresponding values may not be further adjustable. For a given configuration with a selected crystal, this may be sufficient since the capacitance values of C1 and C2 may not need to change for the selected crystal. Programmable code values from the controller 216 or from some other source, including an external interface, however, provides greater flexibility by allowing the capacitance values of C1 and C2 to be programmed and/or adjusted at any time, such as for a different crystals and/or different configurations or electronic systems.

Operation of the crystal oscillator 203 including the crystal amplifier 202 is now briefly described. The crystal amplifier 202 is initially placed into a standby mode and remains in standby while ACT is negated. When ACT is asserted to initiate startup, the controller 216 performs a startup routine or process to initialize oscillation. The startup process is not further described, but generally includes starting with a high value of core bias current via CBA until oscillation is achieved. Once oscillation is determined to be achieved, the controller 216 adjusts CBA to reduce the core bias current to a steady state level. In one embodiment, the steady state current level of the core bias current is known. For example, the controller 216 may store a digital steady state (SS) value in the memory 310 and adjust CBA to the SS value for steady state operation. The memory 310 may be a read-only memory (ROM) or the like. Alternatively, the memory 310 may be a random access memory (RAM) or the like for determining and storing one or more different SS values during operation. In one embodiment, the controller 216 performs the AGC process or the like to determine the steady state level of the core bias current that achieves a signal level at XI, determines the corresponding SS value, and stores the SS value into the memory 310 for future use.

The controller 216 may perform the AGC process upon each startup, such as for determining an adjusted SS value for each operating session, or in response to another stimulus or event, such as a temperature change. The controller 216 may perform the AGC process in response to a change of temperature, such as when TMP indicates that the temperature has changed by a certain amount. For example, at certain increments of temperature change, such as 10, 20, 30, etc., degree increments or the like, the AGC process may be re-run to adjust the core bias current to return the signal amplitude back to a target value. In one embodiment, the controller 216 monitors the signal level of XI via LD provided by the level detector 304 while adjusting CBA. When the signal level of XI is at a predetermined target level determined by a selected threshold value, the level detector 304 asserts LD indicating that the signal level has reached the threshold, the controller 216 determines the steady state level for the core bias current.

It has been observed that as the temperature rises, the amplitude of the oscillating signal, such as on XI, decreases. In order to optimize operating parameters, the amplitude of the oscillating signal developed by the crystal oscillator 203 should be maintained, which in turn results in the need to run the AGC process when the temperatures changes by a certain amount. Even if the amplitude is maintained, the change in temperature changes the operation point of the amplifier devices, which leads to changes in the distortion level of the amplifier devices in turn changing their output impedance over the oscillation period. These changes lead to a frequency change. As temperature changes causing the amplitude of the oscillating signal to change, the AGC process may be used to adjust the core bias current to re-adjust the amplitude of the oscillating signal back to the target value. An increase of the core bias current, however, also contributes to distortion and frequency shift of the oscillating signal. Changes in temperature also have an effect on the operation of the crystal 120.

As described further herein, the capacitance of C1 is made larger than the capacitance of C2, so that the tune capacitors C1 and C2 are unbalanced. This is figuratively illustrated as C1 appearing physically larger than C2, which is only intended to illustrate that the capacitance of C1 is greater than the capacitance of C2. The depiction of the relative size between C1 and C2 in FIG. 3 is for illustration only and does not represent the relative proportion of actual capacitance between the two capacitors. The unbalanced tune capacitors reduce the amount of distortion and frequency shift as compared to a corresponding amplifier core with balanced tune capacitors. As further described herein, the capacitance values of C1 and C2 and the corresponding offset between them may be empirically determined for a given configuration to minimize the frequency shift with temperature changes.

The combined capacitance or equivalent tune (or load) capacitance "CL" is determined for a given crystal. The tune capacitance CL for the unbalanced tune capacitors C1 and C2 remains the same as that of the conventional configuration. CL is equal to the combination of the capacitors C1 and C2, or CL=C1*C2/(C1+C2), in which an asterisk "*" denotes multiplication (the combination is determined in a similar manner as the capacitors coupled in series). In a conventional configuration, the capacitances of C1 and C2 are equal to each other, or C1=C2, and both are equal to a nominal capacitance level to achieve a target frequency. In the unbalanced configuration, however, the capacitance of C1 is increased relative to the nominal level, then the capacitance of C2 is decreased by a corresponding amount from the nominal level so that CL remains unmodified. For example, if CL=10 picofarads (pF) for a given crystal, then in the conventional configuration, C1=C2=20 pF for that crystal. If, however, C2 is increased by 2 pF to 22 pF, then it can be shown that C1 should be decreased to 18.333 pF to ensure that CL remains unmodified for that crystal.

It is noted from the above example that in the unbalanced configuration, the amount of capacitance increase of C1 relative to the nominal level is not necessarily equal to the amount of decrease from the nominal level for C2 to achieve the same tune capacitance CL. Nonetheless, once a particular capacitance offset is determined, C1 may initially be adjusted up by half the capacitance offset while C2 is initially adjusted down by half the capacitance offset. Then, both C1 and C2 are adjusted up or down together by the same amount during an iterative process until the frequency and amplitude of the oscillating signal are at or sufficiently near target levels. This iterative process is the same for externally coupled tune capacitors.

FIG. 4 is a schematic diagram of an alternative amplifier core 410 that may replace the amplifier core shown in FIG. 3. The amplifier core 210 may be implemented according to a CMOS configuration including the P-channel transistor P1 and the N-channel transistor N1, along with the decoupling capacitor CD, and the bias resistor RB. The amplifier core 410 is implemented according to an NMOS configuration in which P1 and CD are eliminated. The current source 306 is provided for both configurations. For the amplifier core 410, however, node 308 is effectively merged into node 204 since P1 and CD are eliminated, and the current source 306 provides the core bias current directly to the amplifier output node 204. RB remains coupled between nodes 204 and 206, and operation is substantially similar. The alternative amplifier core 410 is shown to illustrate that the unbalanced capacitor configuration equally applies to both configurations of the amplifier core (CMOS or NMOS).

FIG. 5 is a simplified schematic diagram of an adjustable tune capacitor 500 that may be used as either one or both of the capacitors C1 and C2 according to one embodiment. The tune capacitor 500 includes a pair of capacitor terminals 502 and 504 representing the terminals of the tune capacitor (C1 or C2) that it implements. Generally, the capacitor terminal 504 is coupled to GND for each tune capacitor, and the capacitor terminal 502 for C1 is coupled to the amplifier output node 204 (XO) and the capacitor terminal 502 for C2 is coupled to the amplifier input node 206 (XI). The configuration may be the same for externally coupled adjustable capacitors. The configuration shown in FIG. 5 is exemplary only in which it is understood that many different adjustable capacitor configurations may be implemented.

The tune capacitor 500 includes a series of N+1 capacitors C0, C1, . . . , CN and a corresponding series of N+1 N-channel transistor switches N0-NN, in which each capacitor is coupled in series with the current terminals of a corresponding one of the transistor switches between the capacitor terminals 502 and 504. Thus, C0 is coupled in series with N0 between the terminals 502 and 504, C1 is coupled in series with N1 between the terminals 502 and 504, and so on, each forming one of multiple switch-capacitor pairs coupled in parallel between the capacitor terminals 502 and 504. One terminal of each of the capacitors C0-CN is coupled to the capacitor terminal 502. In each case, the drain terminal of the transistor switch is coupled to the other terminal of a corresponding one of the capacitors, and the source terminal is coupled to the capacitor terminal 504. Each of the transistor switches N0-NN has a gate terminal receiving a corresponding one of N+1 control bits CPX<0>, CPX<1>, . . . , CPX<N> from the controller 216, in which "X" is either "1" or "2" for CP1 or CP2, respectively. Thus, CPX<0> is provided to the gate terminal of N0, CPX<1> is provided to the gate terminal of N1, and so on.

A series of N+1 resistors R are further provided, each having one terminal coupled to the junction between the resistor-transistor switch pairs between the capacitor terminals 502 and 504. The other terminal of each resistor R is coupled to one current terminal of a corresponding one of a series of N+1 pass gates (a.k.a., transmission gates) G0, G1, . . . , GN. The other current terminal of each of the pass gates G0-GN is coupled to a bias voltage VB. Each pass gate G0-GN is shown implemented as a parallel combination of a P-channel transistor and an N-channel transistor, in which the source terminal of one of the transistors of each pass gate is coupled to the drain terminal of the other, and vice-versa. Each pass gate includes a P-gate control terminal (gate terminal of internal P-channel transistor) and an N-gate control terminal (gate terminal of internal N-channel transistor). The P-gate control terminal of each pass gate G0-GN receives a corresponding one of the control bits CPX<0>-CPX<N>. The corresponding N-gate control terminal of each pass gate G0-GN receives a corresponding one of inverted control bits CPX<0>_B-CPX<N>_B, in which CPX<0>_B is an inverted version of CPX<0>, CPX<1>_B is an inverted version of CPX<1>, and so on.

An additional "balance" capacitor CBX may be coupled between the capacitor terminals 502 and 504, which is CB1 for C1 and CB2 for C2. An enable signal CXEN is provided to the gate terminal of NEN, in which CXEN is C1EN for C1 and C2EN for C2. An additional resistor R is coupled between the drain terminal of NEN and to one current terminal of another pass gate GE. The other current terminal the pass gate GE is coupled to the bias voltage VB. The P-gate control terminal of the pass gate GE receives CXEN, and the corresponding N-gate control terminal of the pass gate GE receives CXEN_B, which is an inverted version of CXEN.

Although not shown, there is an additional parasitic capacitance CPI (not shown) associated with XI and another parasitic capacitance CPO (not shown) associated with XO, in which the parasitic capacitances CPI and CPO may be different (and usually are). The balance capacitor CBX is intended to compensate for the difference in parasitic capacitances of XI and XO, so that the addition of CBX (CB1 for C1 coupled to XO and/or CB2 for C2 coupled to XI) balances the capacitances applied to XI and XO before adjustment of C1 and C2. In one embodiment, CBX is only added to one of the adjustable capacitors. For example, the parasitic capacitance CPI on XI may be greater than the parasitic capacitance CPO on XO, so that CB1 is only added to the tune capacitor C1 while CB2 is omitted for C2 (or CB2=0), to balance capacitance, or CPO+CB1=CPI. In another embodiment CBX is added to both adjustable capacitors with corresponding capacitances to balance the capacitance of XI and XO before adjustment. In either case, a balance capacitor can be added to either C1 or C2, or both, to compensate for the parasitic capacitance of XI and XO to a balanced capacitance CBAL, or CB1+CPO=CB2+CPI=CBAL. The balance capacitor also allows the maximum possible capacitance to reach higher values without increasing the number of bits or without increasing capacitor step size. Increasing the step size may result in a less accurate oscillation frequency.

In operation of the adjustable tune capacitor 500, each control bit CPX<0>–CPX<N> is asserted high to turn on the corresponding transistor switch N0-NN to connect the corresponding capacitor C0-CN between the capacitor terminals 502 and 504, and to turn off the corresponding pass gate G0-GN. Each control bit CPX<0>–CPX<N> is negated low to turn off the corresponding transistor switch N0-NN to remove or decouple the corresponding capacitor C0-CN from the capacitor terminal 504 and to turn on the corresponding pass gate G0-GN to instead couple the capacitor to VB. For example, when CPX<0> is asserted high, N0 is turned on so that C0 is coupled between the capacitor terminals 502 and 504, while the corresponding pass switch G0 is turned off to isolate C0 from VB. When CPX<0> is negated low, N0 is turned off so that C0 is isolated from the capacitor terminal 504, while the corresponding pass switch G0 is turned on to connect C0 to VB through a resistor R. Each of the resistors R has a resistance that is high enough so that the corresponding capacitor does not appear at the operation frequency. When not selected, connecting the non-selected capacitor to a bias node keeps the voltage at the drain of the corresponding NMOS transistor above the reference supply voltage to prevent corresponding parasitic diodes from being turned on which would result in losses and/or degraded performance. The control bits CPX<0>-CPX<N> collectively form a digital control value CPX used to couple selected ones of the capacitors C0-CN in parallel in which the capacitances of the selected capacitors add to select the corresponding capacitance for the tune capacitor C1 or C2. The non-selected ones of the capacitors C0-CN are tied off to the bias voltage to remove and isolate them from the circuit.

The controller 216 enables the adjustable tune capacitor 500 by asserting CXEN high to turn on NEN to couple CBX into the circuit, and by asserting the control bits CPX<0>-CPX<N> to the desired digital control value CPX. The controller 216 disables the adjustable tune capacitor 500, or effectively removes it from the circuit, by negating CXEN low to remove CBX from the circuit, and by asserting the control bits CPX<0>–CPX<N> to a zero value for CPX.

In one embodiment, the capacitances of the capacitors C0-CN form a binary progression from C0 to CN. In this case, C0 has a unitary or singular nominal capacitance CNOM. C1 has twice the nominal capacitance, or CNOM*2, C2 has four times the nominal capacitance, or CNOM*4, and so on up to CN, which as $2^N$ times the nominal capacitance, or CNOM*$2^N$. The capacitor C1 may be implemented as 2 parallel-coupled capacitors each having a capacitance of CNOM, or may be implemented as a single capacitor with a capacitance of 2*CNOM. Similarly, the capacitor C2 may be implemented as 4 parallel-coupled capacitors each having a capacitance of CNOM, or may be implemented as a single capacitor with a capacitance of 4*CNOM, and so on. The digital control value CPX may be considered as a binary code number that determines the additional tune capacitance as CPX*CNOM, in which CPX varies from 0 to $2^N$–1, so that the additional tune capacitance (above CBAL) varies from 0 to $(2^N-1)$*CNOM. CNOM is selected to have a sufficiently small capacitance to allow sufficient granularity for adjusting the tune capacitor, and N is selected to be sufficiently large enough value to provide an appropriate adjustable capacitance range for the particular configuration. The tune capacitance of C1 is CBAL+ CP1*CNOM and the tune capacitance of C2 is CBAL+ CP2*CNOM.

In one embodiment, CNOM has a capacitance of about 82 femtofarads (fF), N is 7 (for an 8-bit code configuration), and CBAL is assumed to be 10 pF (for simplicity of explanation). The capacitance of CBX, if provided, compensates for the parasitic capacitance so that with nominal settings (i.e., $CP_{XI}=CP_{XO}$) the capacitances are substantially identical. The code value CPX thus ranges from 0 to 255, so that the additional capacitance ranges from 0 to 255*82 fF, or 0 to 20.9 pF. In this manner, the total load capacitance varies from 10 pF/2 to (10 pF+20.9 pF)/2, or 5 pF to about 15.5 pF with incremental adjustments of 82 fF between capacitance settings. This will allow a circuit to support, in this example, crystals with load capacitances from 8 pF to 12 pfF with some margin for tuning and IC process variations.

Figure 6:
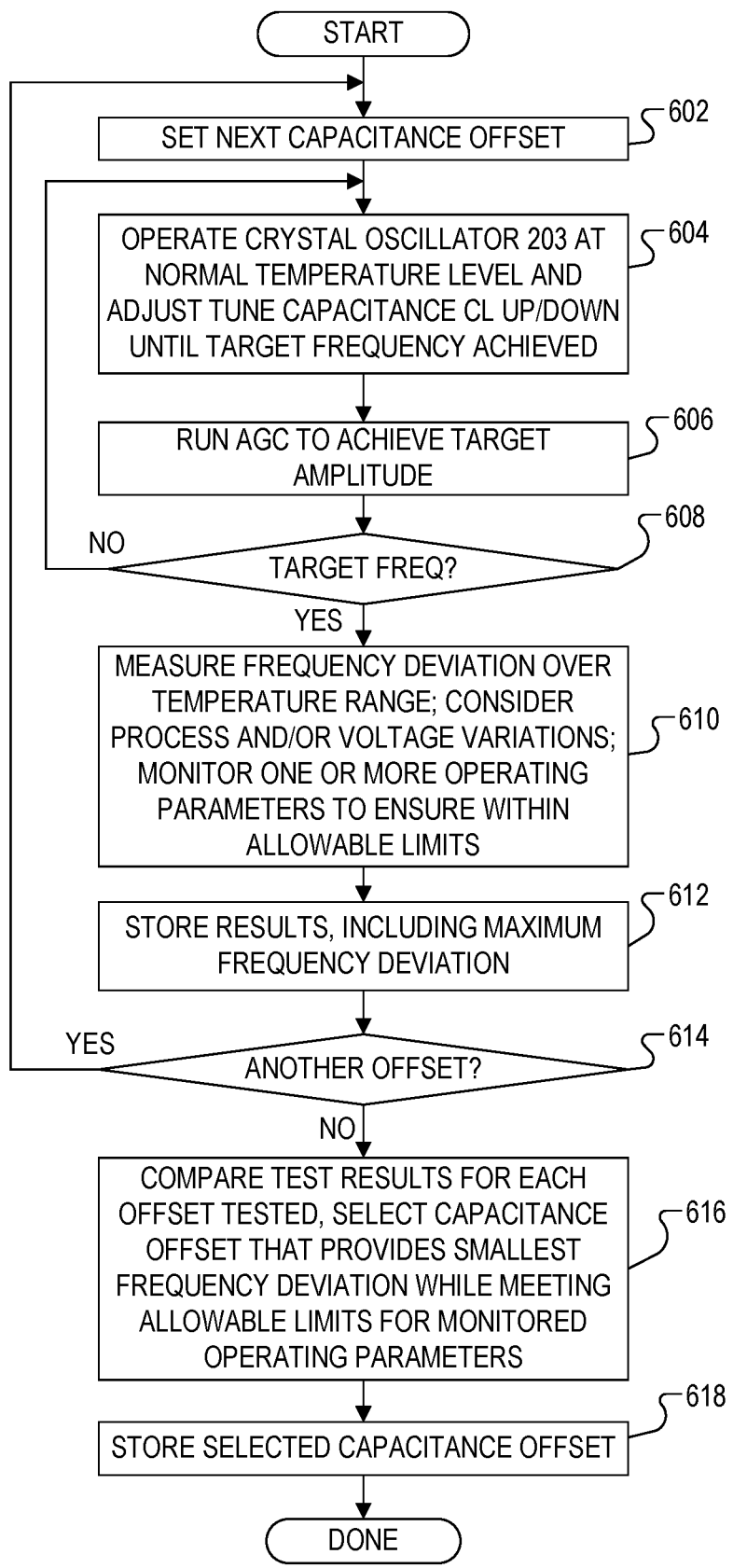
FIG. 6 is a flowchart diagram of a simplified test procedure of the crystal oscillator of FIG. 2 for determining an optimal capacitance offset between the capacitors C1 and C2 of FIG. 3 for minimizing frequency shift according to one embodiment of the present invention.

FIG. 6 is a flowchart diagram of a simplified test procedure of the crystal oscillator 203 for determining an optimal capacitance offset between the capacitors C1 and C2 for minimizing frequency shift according to one embodiment of the present invention. One or more semiconductor chips incorporating the transceiver 100 may be placed into a test apparatus (not shown) or the like for performing various tests including testing of the crystal oscillator 203. Other test procedures performed for other purposes are not further described. The illustrated test procedure is simplified in that it mostly includes testing for different temperatures. It is understood, however, that other variations can be incorporated into the test procedure, including process variations, voltage variations, and possibly even crystal variations for testing more than one crystal type. Process variations can be incorporated into the test procedure by performing the same test on multiple different chips at a time and/or over time. Voltage variations can be incorporated into the test procedure by performing the same test at different source voltages within an allowable or expected range of source voltages. For example, the same or similar test may be performed for each of one or more chips at a minimum source voltage, and again at a maximum source voltage, and possibly again at a normal source voltage. Alternatively, the same or similar test may be performed for each of one or more chips at multiple source voltages within the allowable or expected range of source voltages.

At first block 602, the first or "next" capacitance offset is set between the capacitors C1 and C2, such as by adjusting CP1 and CP2 accordingly. For a configuration in which the capacitors C1 and C2 are externally provided, CP1 and CP2 may still be provided by the controller 216 and provided externally by an appropriate interface (not shown), or may be provided by an external controller (not shown) of the test apparatus. As previously described, CP1 and CP2 may each be in the form of binary code values that determines the amount of capacitance added above the balanced capacitance CBAL for XI and XO. The first capacitance offset may be selected as 0 or no offset between CP1 and CP2 for purposes of comparison. The selected crystal 120 is typically associated with specifications that may include an expected nominal tune capacitance CL to achieve oscillation at the target frequency. For purposes of illustration, it is assumed that the tune capacitance CL is 10 pF, which means that C1 and C2 should each have a capacitance of 20 pF (e.g., according to the previously described relationship CL=C1*C2/(C1+C2)). It is also assumed that CNOM for C1 and C2 is 82 fF so that each increment for each of the code values CP1 and CP1 adds a capacitance of 82 fF. In this manner, CP1 and CP2 may both initially be set to 10 pF, which corresponds to a binary code value of 122 each (i.e., 122*82 fF≈10 pF).

Operation proceeds to block 604 in which the crystal oscillator 203 is initialized and operated at a "normal" temperature level until oscillation is achieved, and the actual frequency is measured and compared to the target frequency. The normal temperature may be a nominal operating temperature level, such as an exemplary ROOM temperature of 25 degrees Celsius (° C.). Although the initial capacitance values may be close to achieve the target frequency, it is understood that one or more variations, such as process variations and/or voltage variations and the like may cause the actual frequency to deviate from the target frequency. The code values CP1 and CP2 are adjusted up or down together to adjust the tune (or load) capacitance CL until the target frequency is achieved. It is noted that the same adjustment, up and/or down, is made to both CP1 and CP2 together to maintain the same offset between C1 and C2.

Although the target frequency may be achieved at block 604, the amplitude of the oscillating signal on XI (or XO) may not be at the target level. So, operation proceeds to block 606 in which the AGC process is performed, either by the XO system 118 or by the test apparatus, until the amplitude of the oscillating signal is at the target amplitude. The AGC process, however, may adjust the core bias current CB provided by the current source 306, which in turn may alter the frequency of the oscillating signal. Thus, operation proceeds to query block 608 to determine whether the oscillating signal is still at the target frequency. If not, operation loops back to block 604 in which the tune capacitance CL is again adjusted up or down, such as by incrementing or decrementing both CP1 and CP2 by the same amount, until the target frequency is once again achieved. Operation loops between blocks 604 and 608 in an iterative process until both the target frequency and target amplitude are achieved.

Once the target frequency and target amplitude are achieved as determined at block 608, operation proceeds to block 610 in which the frequency deviation (or frequency shift) is measured over a temperature range. For example, the target frequency is initially established at a normal temperature, such as room temperature or the like (e.g., 25° C.), and operation is tested for at least one more temperature value, such as a HOT temperature level. In one embodiment, the HOT temperature level may be a maximum allowable temperature value, such as 125° C. Also, operation may be tested at a COLD temperature level, such as a minimum allowable temperature level, such as 0° C. or less. Testing may also be performed at different process and/or different voltage variations. Process variations may be considered by operating multiple semiconductor chips at the same time or over time at the selected temperature levels. Voltage variations may be considered by operating each of one or more chips at different source voltages, such as including a minimum operating voltage and a maximum operation voltage.

The testing at block 610 may also monitor any deviation of one or more operating parameters, such as the phase noise, power supply rejection (PSR), and reverse PSR. Each of these operating parameters may have an allowable range of deviation in which it is desired that any one or more operating parameters remain within the allowable operating range. For example, an acceptable range may include up to 1 decibel (dB) degradation of phase noise and up to 2 dB of PSR degradation for each temperature value/range tested. If any one or more of the monitored operating parameters exceed or violate the allowable operating range, the particular capacitance offset may be rejected.

After the frequency deviations are determined at block 610 for the temperature range and possibly including process and voltage variations and operating parameter limits, operation proceeds to block 612 in which the results are stored including the maximum frequency deviation observed for the corresponding capacitance offset between C1 and C2.

After the results are stored at block 612, operation proceeds to block 614 to query whether another capacitive offset is to be tested. If so, operation loops back to block 602 and a different capacitance offset is selected, and blocks 604 to 614 are repeated at the new capacitance offset. As noted above, the first iteration may be at 0 offset (or no offset) for purposes of comparison. In one embodiment, a set of code offsets may be selected, such as code offsets of 20, 40, 60 and 80 between CP1 and CP2. The code offset is relative to an initial value of CP1 and CP2, such as the initial nominal code value of 122. Thus, for example, a code offset of 20 means that CP1 is increased by 10 while CP2 is decreased by 10 to achieve a total capacitance offset of 20. Also, the initial code value of 122 for both CP1 and CP2 may have been modified during the iterative process performed during blocks 604 to 606. For example, if both of the code values CP1 and CP2 were adjusted at block 604 to 120, then the next capacitance offset is made relative to the adjusted initial value of 120 (in other words, CP1 is increased to 130 while CP2 is reduced to 110 to achieve the offset of 20 relative to the adjusted nominal value).

It is noted that there are practical limits to the total capacitance offset that may be achieved. For example, if the capacitor C1 at XO is set at or near a maximum level (e.g., a setting of 255 for CL≈31 pF), then there is little or no room for further adjustment, such as for tuning frequency. Also, if the capacitor C2 at XI is set below a certain level (such as below 15 pF for a configuration in which CF≈10 pF), then the maximum setting for C1 may not be sufficient to achieve the desired tune capacitance of 10 pF. For example, if C2 is set at 14 pF, then C1 would have to be about 35 pF which may be above the maximum setting in certain configurations. It has been determined that for an embodiment of CL at about 10 pF, a capacitance offset of no more than 6 to 7 pF is sufficient to achieve the desired results.

Operation loops between blocks 602 to 614 for each of multiple capacitance offsets to be tested, and the results for each offset are stored at block 612. After each of several capacitance offsets is tested and corresponding results are stored, operation proceeds to block 616 in which the test results for each offset are compared with each other. At block 616, the capacitance offset that provides the smallest frequency deviation (or frequency shift) while meeting the allowable limits for each of the monitored operating parameters is selected. In the illustrated embodiment, the capacitance offset may be implemented as a code offset value COFF between CP1 and CP2.

At next block 618, the selected capacitor offset COFF may be stored, such as, for example, within the memory 310. In an alternative embodiment, one or more fuses may be provided for either setting the capacitance of C1 and C2, or by setting an offset between C1 and C2. In one embodiment, a set of predetermined capacitance offsets may be determined by blowing a corresponding one of multiple fuses. In an embodiment with external capacitors, the offset may be stored externally or may simply be applied to implement the desired capacitive offset between the external capacitors.

Referring back to FIG. 3, the controller 216 may use the stored COFF value (or the offset determined by at least one fuse) to adjust CP1 and CP2 accordingly. For example, at any specified nominal code value (e.g., 120 or 122 or the like), the controller 216 increases CP1 by COFF/2 and decreases CP2 by COFF/2 to incorporate the desired capacitance offset between C1 and C2 during operation. It is understood that a user of a specific chip and crystal combination may specify an initial code value for setting an initial tune capacitance CL. In one embodiment, the capacitance offset may be enabled or disabled, and assuming that it is enabled, the controller 216 applies COFF between CP1 and CP2. It is also understood that the target frequency and/or target amplitude may not be achieved for a given chip, crystal and voltage combination for the initially selected CL value. The user, therefore, may perform a similar iterative process as described for blocks 604 to 608 until oscillation is achieved at the target frequency and target amplitude. During the iterative process, both CP1 and CP2 are adjusted up and/or down together by the same amount, while the controller 216 maintains COFF between CP1 and CP2, until oscillation is achieved at the target frequency and amplitude.

In an alternative test process, an initial capacitance offset may be determined by equalizing the amplitudes of the oscillating signals on XO and XI. When the tune capacitors C1 and C2 are set at the same capacitance value, XO tends to have a higher amplitude as compared to XI. In the alternative test process, the capacitance offset between C1 and C2 is adjusted until the amplitudes of both XI and XO are both equal to the target amplitude and the target frequency is achieved. An iterative test process may be used to achieve the desired result. The resulting offset may be used as COFF, or it may be an initial nominal offset used at block 602, in which additional capacitance offsets may be tested until optimal results are achieved.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A crystal driver circuit for driving a crystal to oscillate at a resonant frequency, comprising:
an amplifier input node and an amplifier output node for coupling across the crystal;
an amplifier having an input coupled to said amplifier input node and having an output coupled to said amplifier output node;
a current source that provides a core bias current to said amplifier; and
a first tune capacitor coupled between said amplifier output node and a reference node and having a first capacitance, and a second tune capacitor coupled between said amplifier input node and said reference node and having a second capacitance, wherein said first capacitance is greater than said second capacitance by a capacitance offset that has been determined to minimize frequency shift over an operating temperature range of the crystal driver circuit;
wherein said capacitance offset is maintained during operation of the crystal driver circuit regardless of any change in temperature throughout said operating temperature range of the crystal driver circuit.

2. The crystal driver circuit of claim 1, wherein:
said first tune capacitor is adjustable and has and adjust input;
wherein said second tune capacitor is adjustable and has an adjust input; and
further comprising a controller coupled to said adjust input of each of said first and second tune capacitors.

3. The crystal driver circuit of claim 2, further comprising a memory coupled to said controller that stores an offset value indicative of said capacitance offset, and wherein said controller uses said offset value to set said first and second capacitances.

4. The crystal driver circuit of claim 2, wherein each of said first and second tune capacitors comprises a plurality of capacitors and a corresponding plurality of switches, and wherein said controller controls said plurality of switches for selecting from among said plurality of capacitors.

5. The crystal driver circuit of claim 4, wherein said plurality of capacitors are organized as a binary progression of capacitances based on a nominal capacitance value and wherein said controller provides a digital code to control said plurality of switches for selecting a corresponding one of said first and second capacitances as a multiple of said nominal capacitance value.

6. The crystal driver circuit of claim 4, further comprising a balance capacitor coupled between said first and second capacitor terminals having a capacitance that compensates for a difference between parasitic capacitances of said amplifier input node and said amplifier output node.

7. The crystal driver circuit of claim 1, further comprising a controller that adjusts said first tune capacitor and said second tune capacitor together in the same direction up or down to achieve a target frequency level while maintaining said capacitance offset between said first capacitance and said second capacitance.

8. The crystal driver circuit of claim 1, further comprising a controller that retrieves said capacitance offset from a memory and increases said first capacitance from a nominal value by half of said capacitance offset and decreases said second capacitance from said nominal value by half of said capacitance offset to establish initial capacitances of said first and second tune capacitors.

9. The crystal driver circuit of claim 1, wherein said capacitance offset is selected from a plurality of capacitance offsets, wherein each of said plurality of capacitance offsets is tested at room temperature to achieve a target frequency and target amplitude and then tested to determine a corresponding frequency deviation that is measured over a plurality of temperatures below and above said room temperature within said operating temperature range, and wherein said capacitance offset is selected from among said plurality of capacitance offsets as having the least minimum frequency deviation over said operating temperature range.

10. An electronic circuit, comprising:
a crystal having a first terminal and a second terminal;
a crystal amplifier, comprising:
an amplifier having an input coupled to said first terminal of said crystal and having an output coupled to said second terminal of said crystal; and
a current source that provides a core bias current to said amplifier; and
a first tune capacitor coupled between said second terminal of said crystal and a reference node and having a first capacitance, and a second tune capacitor coupled between said first terminal of said crystal and said reference node and having a second capacitance, wherein said first capacitance is greater than said second capacitance by a capacitance offset that has been determined to minimize frequency shift over an operating temperature range of said crystal amplifier;
wherein said capacitance offset is maintained during operation of said crystal amplifier regardless of any change in temperature throughout said operating temperature range of said crystal amplifier.

11. The electronic circuit of claim 10, wherein:
said first tune capacitor is adjustable and has and adjust input;
wherein said second tune capacitor is adjustable and has an adjust input; and
further comprising a controller coupled to said adjust input of each of said first and second tune capacitors.

12. The electronic circuit of claim 11, wherein each of said first and second tune capacitors comprises a plurality of capacitors and a corresponding plurality of switches, and wherein said controller controls said plurality of switches for selecting from among said plurality of capacitors.

13. A method of driving a crystal to oscillate at a resonant frequency, comprising:
providing an amplifier input node and an amplifier output node for coupling across the crystal;
providing an amplifier having an input coupled to the amplifier input node and having an output coupled to the amplifier output node;
providing a core bias current to drive the amplifier;
providing a first tune capacitor coupled between the amplifier output node and a reference node and having a first capacitance;
providing a second tune capacitor coupled between the amplifier input node and the reference node and having a second capacitance;
setting the first capacitance greater than the second capacitance by a capacitance offset that has been determined to minimize frequency shift over an operating temperature range of the crystal; and
maintaining the capacitance offset during operation regardless of any change in temperature throughout the operating temperature range during operation.

14. The method of claim 13, wherein said setting the first capacitance greater than the second capacitance comprises setting the first and second capacitances to have a combined capacitance that achieves an oscillating signal having a target frequency.

15. The method of claim 13, wherein:
said providing a first tune capacitor comprises providing a first adjustable tune capacitor;
wherein said providing a second tune capacitor comprises providing a second adjustable tune capacitor; and
wherein said setting the first capacitance greater than the second capacitance comprises adjusting the first and second capacitances with the capacitance offset and to have a combined capacitance that achieves an oscillating signal having a target frequency.

16. The method of claim 15, further comprising storing an offset value indicative of the capacitance offset.

17. The method of claim 15, wherein said providing a first adjustable tune capacitor and said providing a second adjustable tune capacitor each comprises providing a plurality of capacitors and a corresponding plurality of switches and controlling the plurality of switches for selecting from among the plurality of capacitors.

18. The method of claim 17, wherein said providing a plurality of capacitors comprises organizing the plurality of capacitors as a binary progression of capacitances based on a nominal capacitance value and wherein said controlling the plurality of switches comprises providing a digital code for selecting a corresponding one of the first and second capacitances as a multiple of the nominal capacitance value.

19. The method of claim 17, further comprising providing a balance capacitor coupled between the first and second capacitor terminals having a capacitance that compensates for a difference between parasitic capacitances of the amplifier input node and the amplifier output node.

20. The method of claim 13, further comprising adjusting the first tune capacitor and the second tune capacitor together in the same direction up or down to achieve a target frequency level while maintaining the capacitance offset between the first capacitance and the second capacitance.

* * * * *